United States Patent
Goto

(10) Patent No.: US 6,831,260 B2
(45) Date of Patent: Dec. 14, 2004

(54) ELECTRON BEAM EXPOSURE APPARATUS, REDUCTION PROJECTION SYSTEM, AND DEVICE MANUFACTURING METHOD

(75) Inventor: Susumu Goto, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 179 days.

(21) Appl. No.: 10/150,153

(22) Filed: May 20, 2002

(65) Prior Publication Data

US 2002/0186357 A1 Dec. 12, 2002

(30) Foreign Application Priority Data

May 21, 2001 (JP) ........................................ 2001-151522

(51) Int. Cl.$^7$ ........................... G01J 40/00; H01J 40/00
(52) U.S. Cl. ............... 250/200; 250/492.22; 250/492.2; 250/492.23
(58) Field of Search .................... 250/492.23, 396 ML, 250/492.1, 492.22, 492.2, 200; 430/296, 30

(56) References Cited

U.S. PATENT DOCUMENTS

| | | | | |
|---|---|---|---|---|
| 4,376,249 A | * | 3/1983 | Pfeiffer et al. | ........ 250/396 ML |
| 4,812,662 A | | 3/1989 | Goto et al. | ............... 250/491.1 |
| 4,939,371 A | | 7/1990 | Goto | .......................... 250/397 |
| 5,466,549 A | * | 11/1995 | Yamada | ....................... 430/30 |
| 5,864,142 A | | 1/1999 | Muraki et al. | ........... 250/491.1 |
| 5,929,454 A | | 7/1999 | Muraki et al. | ........... 250/491.1 |
| 6,069,684 A | * | 5/2000 | Golladay et al. | ............. 355/53 |
| 6,130,432 A | * | 10/2000 | Pfeiffer et al. | ....... 250/396 ML |
| 6,246,065 B1 | * | 6/2001 | Goto | ..................... 250/492.23 |
| 6,323,499 B1 | * | 11/2001 | Muraki et al. | ......... 250/492.22 |

OTHER PUBLICATIONS

Heritage, M.B. "Electron–projection microfabrication system," *Proceedings of the 2nd Conference on Structure/Property Relationships in Thick Films and Bulk Coatings*, Feb. 10–12, 1975, San Francisco, CA, pp. 1135–1140.

* cited by examiner

Primary Examiner—Jack Berman
Assistant Examiner—Johnnie L. Smith, II
(74) Attorney, Agent, or Firm—Fitzpatrick, Cella, Harper & Scinto

(57) ABSTRACT

A blur and image distortion of an electron beam on a sample are reduced even at a large converging angle of the electron beam. A reduction projection optical system (120) has an immersion lens (108) on the image plane (wafer 111) side. A collimator lens (pupil control optical system) 106 is arranged between the reduction projection optical system (120) and its object plane (mask 104). The collimator lens (106) arranges the entrance pupil (110) of the reduction projection optical system (120) at a finite position from the image plane on the downstream side of the image plane of the reduction projection optical system (120). This can minimize any blur and image distortion of an electron beam on a sample.

15 Claims, 6 Drawing Sheets

F I G. 3
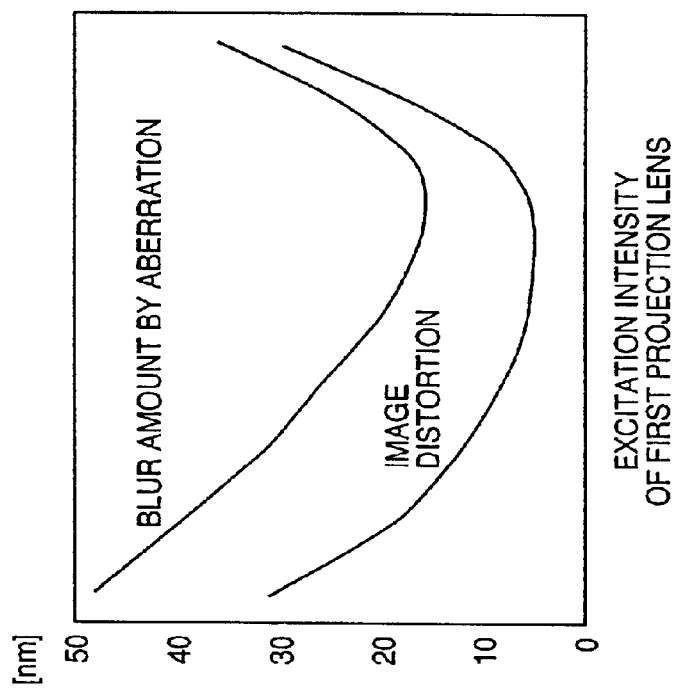

ELECTRON BEAM EXPOSURE APPARATUS, REDUCTION PROJECTION SYSTEM, AND DEVICE MANUFACTURING METHOD

FIELD OF THE INVENTION

The present invention relates to an electron beam exposure apparatus, reduction projection system, and device manufacturing method and, more particularly, to an electron beam exposure apparatus for drawing a pattern on a sample by an electron beam, a reduction projection system suitable for the electron beam exposure apparatus, and a device manufacturing method using the electron beam exposure apparatus.

BACKGROUND OF THE INVENTION

An electron beam exposure apparatus can form a fine circuit pattern but has not been introduced into the semiconductor manufacturing process so far. This is because its throughput is lower than that of an optical exposure method. In recent years, various techniques have been developed to remove this drawback. One of these methods is a transfer exposure method of exposing a large exposure area at once by using a transfer mask. A projection lens adopted in an apparatus of this type is a symmetrical doublet type magnetic lens.

The use of the symmetrical magnetic doublet allows correcting all anisotropic aberrations among third-order aberrations, chromatic aberration concerning rotation and magnification, and isotropic distortion (M. B. Heritage, J. Vac. Sci. & Technol., Vol. 12, No. 6, November/December, 1975).

Even in the use of the symmetrical magnetic doublet, the aberration amount increases for a large converging angle (aperture) of an electron beam. Along with this, the resolution decreases, failing to constitute a practical electron beam exposure apparatus. For example, to obtain an allowable aberration amount necessary to attain a resolution of 100 nm or less, the electron beam converging angle must be set to 2 to 3 mrad. At such a converging angle, the image greatly blurs due to the coulomb interaction. To avoid this, the electron beam irradiation amount, i.e., current must be decreased, which limits the throughput.

An immersion lens method of forming a lens magnetic field for converging an electron beam on an image plane of a projection lens can attain small-axial aberration conditions even at a large converging angle (aperture), compared to a method of not forming any lens magnetic field on the image plane.

If immersion lenses are employed as the image plane side electron lens of a projection lens made up of two electron lenses, the symmetry between front and rear lenses cannot be obtained, unlike the symmetrical magnetic doublet. It is difficult to cancel image distortion between the front and rear lenses, generating a large image distortion.

SUMMARY OF THE INVENTION

The present invention has been made in consideration of the above situation, and has as its object to reduce any blur and image distortion of an electron beam on a sample even at a large converging angle of the electron beam.

According to the first aspect of the present invention, there is provided an electron beam exposure apparatus comprising a reduction projection optical system having an immersion lens, a table which holds an object to be exposed, and a pupil control optical system which forms an entrance pupil at a finite position on a downstream side of an image plane, wherein the reduction projection optical system and the pupil control system project a pattern onto the object.

According to the preferred embodiment of the present invention, the pupil control optical system preferably forms the entrance pupil at a position where both a blur and image distortion of the electron beam on the object are reduced.

According to the further preferred embodiment of the present invention, the pupil control optical system forms the entrance pupil at a position where both a blur and image distortion of the electron beam on the object are substantially minimized.

According to the preferred embodiment of the present invention, the pupil control optical system includes a field lens.

According to the preferred embodiment of the present invention, the pupil control optical system is arranged between the reduction projection optical system and the object plane.

According to the preferred embodiment of the present invention, the reduction projection optical system is formed from two electron lenses, and one of the electron lenses includes the immersion lens.

According to the second aspect of the present invention, there is provided an electron beam exposure apparatus comprising a reduction projection optical system having an immersion lens, a table which holds an object to be exposed, and a field lens, wherein the reduction projection optical system and the field lens project a pattern onto the object.

According to the preferred embodiment of the present invention, the reduction projection optical system is preferably formed from two electron lenses, and one of the electron lenses includes the immersion lens.

According to the third aspect of the present invention, there is provided a reduction projection system for reducing and projecting an image formed by an electron beam, comprising a reduction projection optical system having an immersion lens, and a pupil control optical system which forms an entrance pupil of the reduction projection system at a finite position on a downstream side of the image plane of the reduction projection system.

According to the fourth aspect of the present invention, there is provided a reduction projection system for reducing and projecting an image formed by an electron beam, comprising a reduction projection optical system having an immersion lens, and a field lens arranged on an object side of said reduction projection optical system.

According to the fifth aspect of the present invention, there is provided a device manufacturing method comprising the steps of applying a photosensitive agent to a substrate, drawing a pattern on the substrate by an electron beam exposure apparatus, and developing the substrate, wherein the electron beam exposure apparatus has a reduction projection optical system having an immersion lens, a table which holds the substrate, and a pupil control optical system which forms an entrance pupil at a finite position on a downstream side of an image plane, wherein the reduction projection optical system and the pupil control system project a pattern onto the substrate.

According to the sixth aspect of the present invention, there is provided a projection system comprising a plurality of electron lenses including an immersion lens, wherein an electron incidence side of the plurality of electron lenses is not telecentric.

According to the seventh aspect of the present invention, there is provided an exposure apparatus comprising a stage for holding an object to be exposed, and a plurality of electron lenses, including an immersion lens, for projecting an electron beam onto the object, wherein said plurality of electron lenses are not telecentric on an electron incidence side thereof.

According to the preferred embodiment of the present invention, the exposure apparatus further comprises a stage for holding a mask, and an illuminator for illuminating the mask with the electron beam, wherein a plurality of electron lenses project the electron beam from the mask onto a wafer as the object to be exposed.

According to the eighth aspect of the present invention, there is provided a device manufacturing method comprising the steps of exposing a substrate by using an exposure apparatus, and developing the exposed substrate, wherein the exposure apparatus comprises s stage for holding the substrate and a plurality of electron lenses, including an immersion lens, for projecting an electron beam onto the substrate, wherein said plurality of electron lenses are not telecentric on an electron incidence side thereof.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 3 is a graph showing a change in the image distortion of the reduction projection optical system 10 and a change in blur amount caused by aberration as a function of the excitation intensity of the electron lens 2 (first projection lens) when the entrance pupil 7 in FIG. 1 is moved close to the image plane 4 on the downstream side of the image plane 4;

DETAILED DESCRIPTION OF THE PREFERRED EMBODIMENTS

Figure 1:
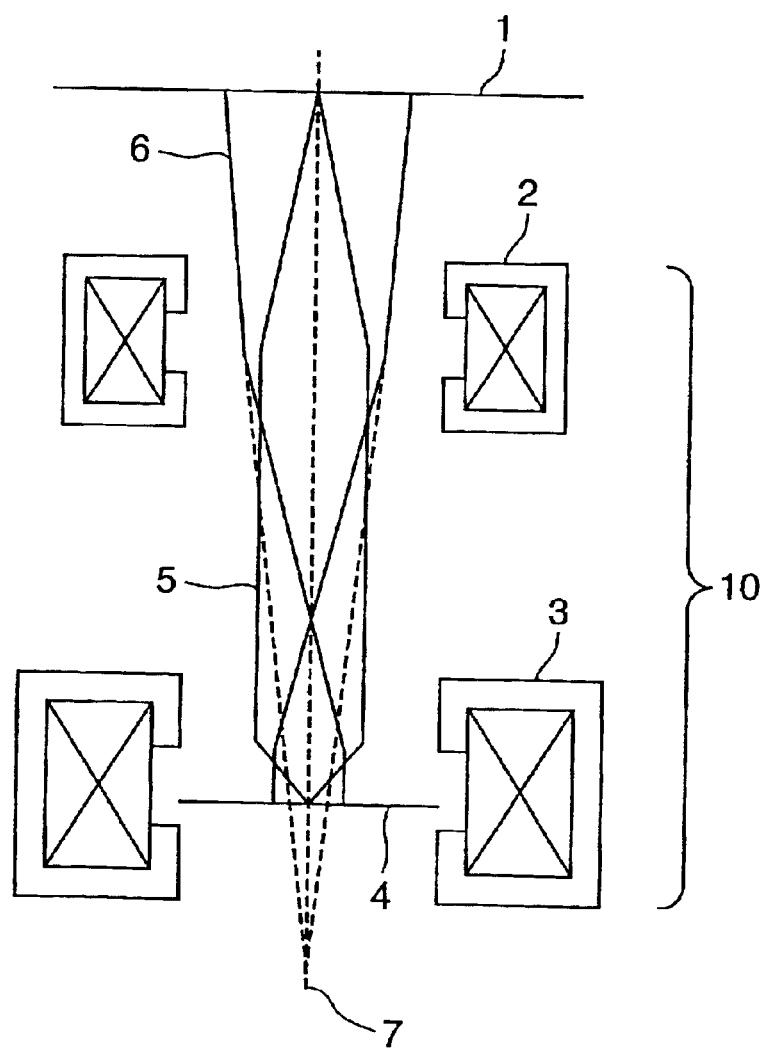
FIG. 1 is a view showing the schematic arrangement and beam of a reduction projection optical system which constitutes part of an electron beam exposure apparatus.

The principle of the present invention will be described with reference to FIGS. 1 to 3. FIG. 1 is a view showing the schematic arrangement and beam of a reduction projection optical system which constitutes part of an electron beam exposure apparatus. Reference numeral 10 denotes a reduction projection optical system; 1, an object plane of the reduction projection optical system 10; 2, an upper electron lens (first projection lens) out of two electron lenses which constitute the reduction projection optical system 10; 3, an immersion lens as a lower electron lens (second projection lens) out of the two electron lenses which constitute the reduction projection optical system 10; and 4, an image plane of the reduction projection optical system 10. The reduction projection optical system 10 reduces and projects an image (e.g., a transfer pattern or the intermediate image of an electron source) on the object plane 1 onto a wafer (sample) 111 set on the image plane. A pupil control optical system (not shown) arranged on the input stage of the reduction electron optical system 10 determines the incident angle and entrance pupil 7 of an electron beam incident on the reduction projection optical system 10. Each of the two electron lenses 2 and 3 which constitute the reduction electron optical system 10 can be formed from one or a plurality of electron lenses. The reduction projection optical system 10 may be made up of a plurality of electron lenses other than just two electron lenses.

Figure 2:
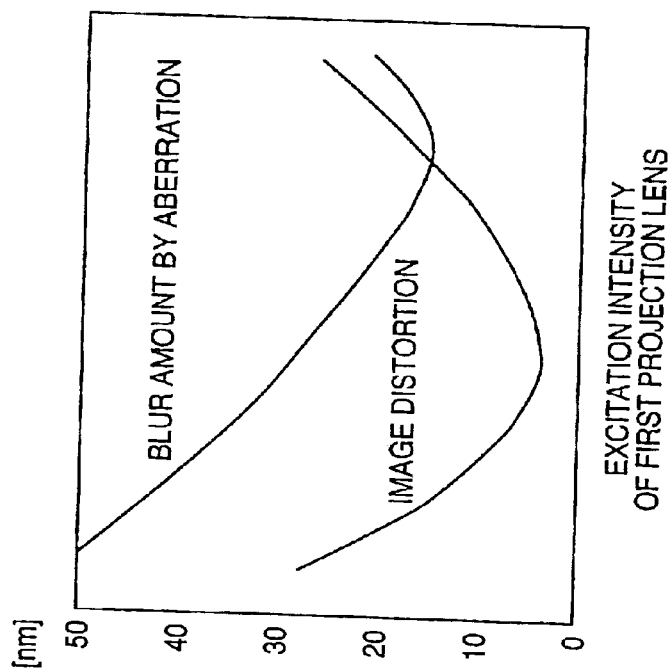
FIG. 2 is a graph showing a change in the image distortion of a reduction projection optical system 10 and a change in blur amount caused by aberration as a function of the excitation intensity of an electron lens 2 (first projection lens) when an entrance pupil 7 in FIG. 1 is set at an infinity position on the downstream side of an image plane 4.

FIG. 2 is a graph showing a change in the image distortion of the reduction projection optical system 10 and a change in blur amount caused by aberration as a function of the excitation intensity of the electron lens 2 (first projection lens) when the entrance pupil 7 in FIG. 1 is set at an infinity position on the downstream side of the image plane 4. In FIG. 2, the excitation intensity of the first projection lens 2 at which the minimum value of the blur amount caused by aberration can be obtained, and the excitation intensity of the first projection lens 2 at which the minimum value of image distortion can be obtained are greatly different from each other. If the reduction projection optical system 10 is set to conditions which provide a minimum value of the blur amount caused by aberration, image distortion increases to an unpractical level.

FIG. 3 is a graph showing a change in the image distortion of the reduction projection optical system 10 and a change in blur amount caused by aberration as a function of the excitation intensity of the electron lens 2 (first projection lens) when the incident angle of an electron beam on the reduction projection optical system is changed and the entrance pupil 7 in FIG. 1 is moved close to the image plane 4 on the downstream side of the image plane 4. In FIG. 3, the excitation intensity of the first projection lens 2 at which a minimum value of the blur amount caused by aberration is obtained, and the excitation intensity of the projection lens 2 at which a minimum value of image distortion is obtained can be made to coincide with each other.

As described above, an immersion electron lens is adopted as an electron lens on the image plane 4 side out of two electron lenses which constitute the reduction projection optical system 10. The entrance pupil 7 of the reduction projection optical system 10 is arranged at a finite position (e.g., position close to the image plane 4) from the image plane 4 on the downstream side of the image plane 4. Even at a large converging angle of the electron beam, both the blur amount caused by aberration and the image distortion amount can be minimized in the reduction projection optical system 10.

Figure 4:
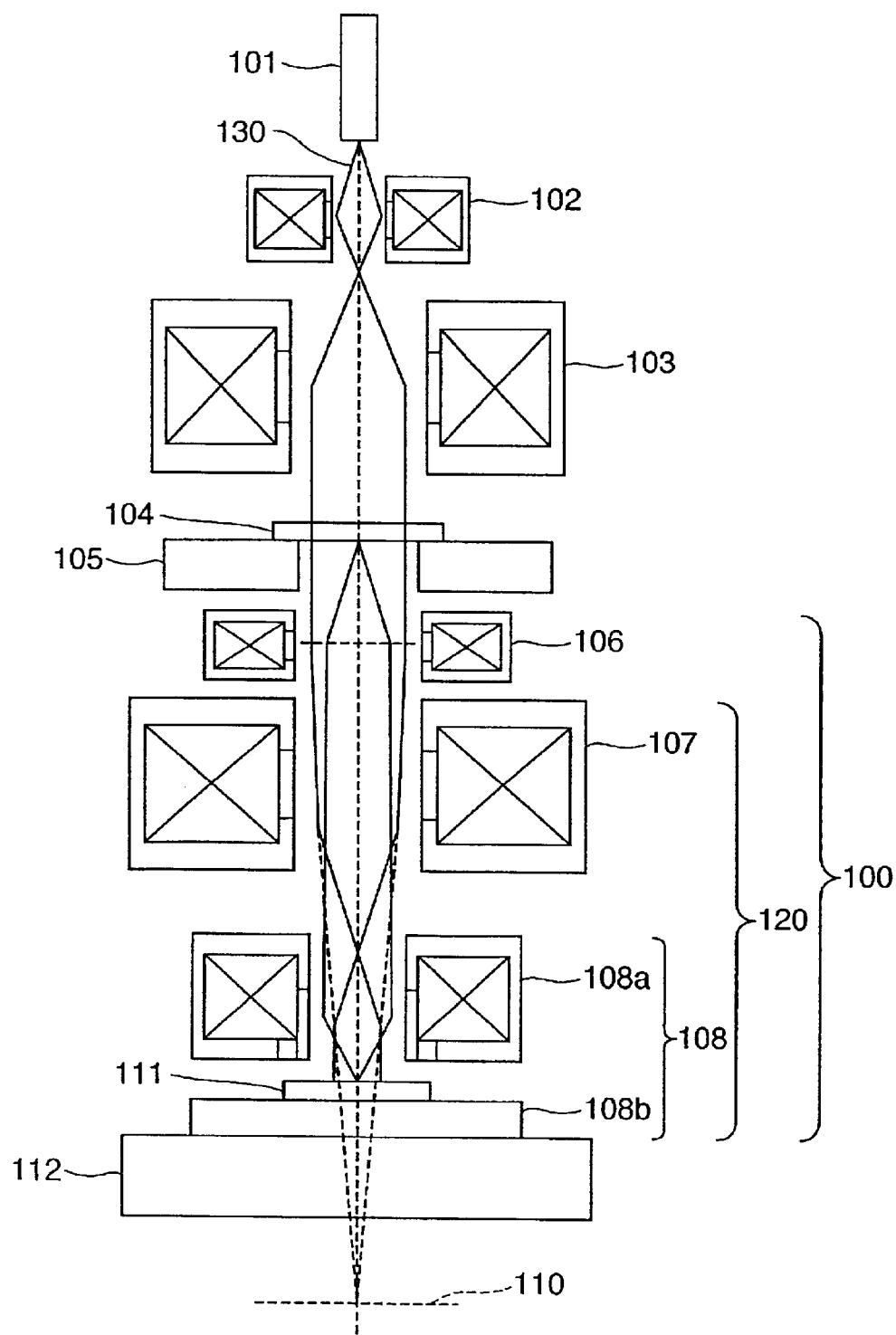
FIG. 4 is a view showing the schematic arrangement of an electron beam exposure apparatus according to a preferred embodiment of the present invention.

A preferred embodiment of the present invention to which the above principle is applied will be explained. FIG. 4 is a view showing the schematic arrangement of an electron beam exposure apparatus according to the preferred embodiment of the present invention. In the electron beam exposure apparatus shown in FIG. 4, electron beams 130 emitted by an electron gun (electron source) 101 are collimated via electron lenses 102 and 103 to enter a transfer mask 104 set on a mask stage 105. The transfer mask 104 is disposed on the object plane of a reduction projection system 100 which is not telecentric on the electron beams incidence side (object side) and has a field lens 106 and a reduction projection optical system 120. The electron beam having passed through the transfer mask 104 enters the reduction projection optical system 120 via the field lens (pupil control optical system) 106. The field lens 106 is arranged so that an entrance pupil 110 of the projection system 100 is formed at a position (finite position from the image plane) close to the image plane on the downstream side of the image plane (position of a wafer 111) of the projection system 100. The reduction projection optical system 120 is comprised of, e.g., two electron lenses, i.e., upper and lower electron lenses 107 and 108. The reduction projection optical system 120 reduces and projects the exposure pattern of the transfer mask 104 onto the wafer (sample) 111. The lower (i.e., image plane side) electron lens 108 is an immersion lens capable of realizing small aberration by setting the wafer 111 to be exposed in a magnetic field. The lower electron lens 108 has an upper pole 108a arranged above the wafer 111, and a lower pole 108b arranged below the wafer 111. The lower pole 108b is a plate member made of a magnetic material, and is mounted on a wafer stage (table) 112.

By adopting the field lens (pupil control optical system) 106, the entrance pupil 110 of the reduction projection optical system 120 can be arranged at the above-mentioned position, i.e., finite position from the image plane on the downstream side of the image plane of the projection system 100 without changing the setting conditions of the optical system on the input stage (upstream or electron gun side) of the reduction projection optical system 120. The position of the entrance pupil 110 of the reduction projection system 100 is so set as to minimize both the image distortion amount on the image plane (sample) and the blur amount of a charged-particle beam caused by aberration. The position of the entrance pupil 110 can be determined by evaluating the image distortion amount and blur amount while changing the excitation conditions of the field lens 106 and upper electron lens 107. The image distortion amount can be obtained by, e.g., evaluating an exposure result. The blur amount of a charged-particle beam caused by aberration can be evaluated based on, e.g., the leading and trailing edges of the current distribution of a charged-particle beam on the wafer 111 or image plane.

A device production method using this electron beam exposure apparatus will be explained.

Figure 5:
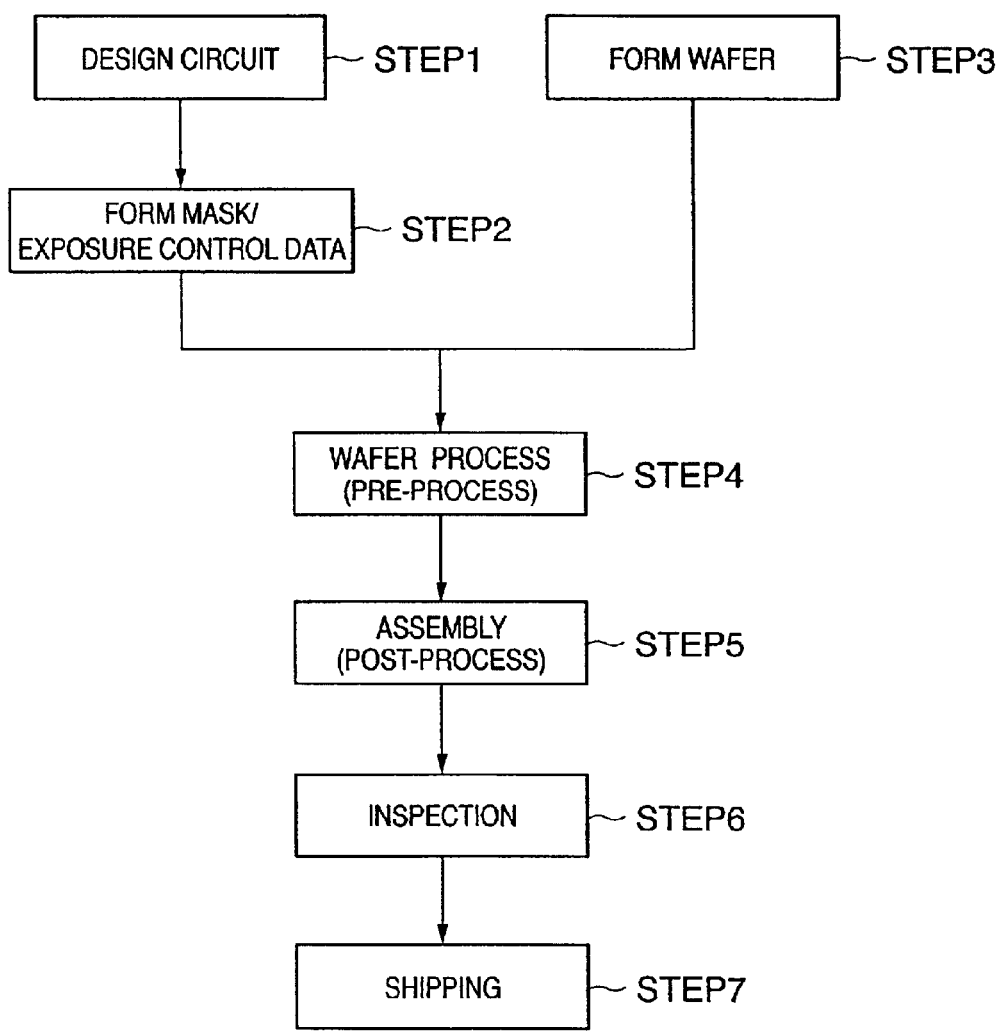
FIG. 5 is a flow chart showing the manufacturing flow of a microdevice (semiconductor chip such as an IC or LSI, liquid crystal panel, CCD, thin-film magnetic head, micromachine, or the like)

FIG. 5 is a flow chart showing the manufacturing flow of a microdevice (semiconductor chip such as an IC or LSI, liquid crystal panel, CCD, thin-film magnetic head, micromachine, or the like). In step 1 (circuit design), a semiconductor device circuit is designed. In step 2 (mask/exposure control data formation), a mask 104 for the electron beam exposure apparatus is formed based on the designed circuit pattern. Alternatively, in an electron beam exposure apparatus for ON/OFF-controlling radiation of an electron beam without using any mask, exposure control data for controlling the ON/OFF state of radiation or the like is generated. In step 3 (wafer formation), a wafer is formed by using a material such as silicon. In step 4 (wafer process) called a pre-process, the mask prepared in step 2 is set in the exposure apparatus, or the exposure control data is input to the exposure apparatus. An actual circuit is formed on the wafer by lithography using the exposure apparatus and the wafer prepared in step 3. Step 5 (assembly) called a post-process is the step of forming a semiconductor chip by using the wafer formed in step 4, and includes processes such as an assembly process (dicing and bonding) and packaging process (chip encapsulation). In step 6 (inspection), the semiconductor device manufactured in step 5 undergoes inspections such as an operation confirmation test and durability test. After these steps, the semiconductor device is completed and shipped (step 7).

Figure 6:
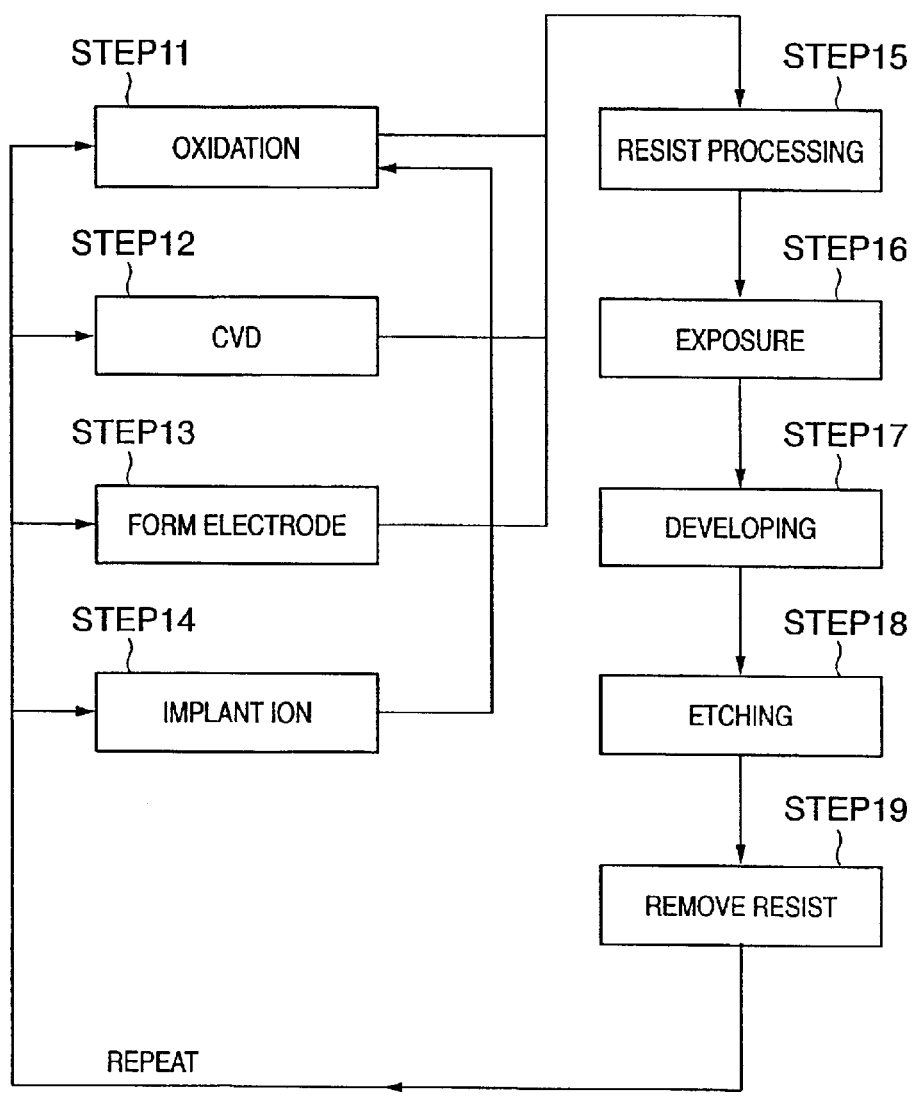
FIG. 6 is a flow chart showing the detailed flow of the wafer process shown in FIG. 5.

FIG. 6 is a flow chart showing the detailed flow of the wafer process shown in FIG. 5. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), a circuit pattern is drawn on the wafer by the electron beam exposure apparatus. In step 17 (developing), the exposed wafer is developed. In step 18 (etching), the resist is etched except for the developed resist image. In step 19 (resist removal), an unnecessary resist after etching is removed. These steps are repeated to form multiple circuit patterns on the wafer.

The use of the manufacturing method of the embodiment enables manufacturing a highly integrated semiconductor device at low cost, which is difficult to manufacture in the prior art.

The present invention can reduce any blur and image distortion of an electron beam on a sample even at a large converging angle of the electron beam.

As many apparently widely different embodiments of the present invention can be made without departing from the spirit and scope thereof, it is to be understood that the invention is not limited to the specific embodiments thereof except as defined in the claims.

What is claimed is:

1. An electron beam exposure apparatus comprising:
    a reduction projection optical system having an immersion lens;
    a table which holds an object to be exposed; and
    a pupil control optical system which forms an entrance pupil at a finite position on a downstream side of an image plane,
    wherein said reduction projection optical system and said pupil control system project a pattern onto the object.

2. The apparatus according to claim 1, wherein said pupil control optical system forms the entrance pupil at a position where both a blur and image distortion of the electron beam on the object are reduced.

3. The apparatus according to claim 1, wherein said pupil control optical system forms the entrance pupil at a position where both a blur and image distortion of the electron beam on the object are substantially minimized.

4. The apparatus according to claim 1, wherein said pupil control optical system includes a field lens.

5. The apparatus according to claim 1, wherein said pupil control optical system is arranged between said reduction projection optical system and the object plane.

6. The apparatus according to claim 1, wherein said reduction projection optical system is formed from two electron lenses, and one of the electron lenses includes the immersion lens.

7. An electron beam exposure apparatus comprising:
    a reduction projection optical system having an immersion lens;
    a table which holds an object to be exposed; and a field lens, wherein said reduction projection optical system and said field lens project a pattern onto the object.

8. The apparatus according to claim 7, wherein said reduction projection optical system is formed from two electron lenses, and one of the electron lenses includes the immersion lens.

9. A reduction projection system for reducing and projecting an image formed by an electron beam, comprising:

a reduction projection optical system having an immersion lens; and a pupil control optical system which forms an entrance pupil of said reduction projection system at a finite position on a downstream side of the image plane of said reduction projection system.

10. A reduction projection system for reducing and projecting an image formed by an electron beam, comprising:

a reduction projection optical system having an immersion lens; and a field lens arranged on an object side of said reduction projection optical system.

11. A device manufacturing method comprising the steps of:

applying a photosensitive agent to a substrate;

drawing a pattern on the substrate by an electron beam exposure apparatus; and developing the substrate, wherein the electron beam exposure apparatus has a reduction projection optical system having an immersion lens;

a table which holds the substrate; and a pupil control optical system which forms an entrance pupil at a finite position on a downstream side of an image plane, wherein said reduction projection optical system and said pupil control system project a pattern onto the substrate.

12. An exposure apparatus comprising:

a stage for holding an object to be exposed; and a plurality of electron lenses, including an immersion lens, for projecting an electron beam onto the object, wherein said plurality of electron lenses are not telecentric on an electron incidence side thereof.

13. An exposure apparatus according to claim 12, further comprising:

a stage for holding a mask; and an illuminator for illuminating the mask with the electron beam, wherein a plurality of electron lenses project the electron beam from the mask onto a wafer as the object to be exposed.

14. A device manufacturing method comprising the steps of:

exposing a substrate by using an exposure apparatus; and developing the exposed substrate, wherein said exposure apparatus comprises a stage for holding the substrate and a plurality of electron lenses, including an immersion lens, for projecting an electron beam onto the substrate, wherein said plurality of electron lenses are not telecentric on an electron incidence side thereof.

15. A device manufacturing method according to claim 14, wherein said exposure apparatus further comprises a stage for holding a mask and an illuminator for illuminating the mask with the electron beam, wherein a plurality of electron lenses project the electron beam from the mask onto the substrate.

* * * * *